United States Patent
Kurome et al.

(10) Patent No.: US 7,375,518 B2
(45) Date of Patent: May 20, 2008

(54) STRUCTURE FOR REDUCING NOISE IN MAGNETIC RESONANCE IMAGING APPARATUS

(75) Inventors: Akira Kurome, Kashiwa (JP); Yoshihide Wadayama, Hitachi (JP)

(73) Assignee: Hitachi Medical Corporation, Tokyo (JP)

( * ) Notice: Subject to any disclaimer, the term of this patent is extended or adjusted under 35 U.S.C. 154(b) by 101 days.

(21) Appl. No.: 10/595,362

(22) PCT Filed: Oct. 14, 2004

(86) PCT No.: PCT/JP2004/015137

§ 371 (c)(1),
(2), (4) Date: Apr. 12, 2006

(87) PCT Pub. No.: WO2005/037101

PCT Pub. Date: Apr. 28, 2005

(65) Prior Publication Data

US 2007/0001675 A1    Jan. 4, 2007

(30) Foreign Application Priority Data

Oct. 15, 2003    (JP) .............................. 2003-355128

(51) Int. Cl.
*G01V 3/00* (2006.01)
(52) U.S. Cl. .................... 324/307; 324/309; 324/318
(58) Field of Classification Search ......... 324/300–322
See application file for complete search history.

(56) References Cited

U.S. PATENT DOCUMENTS

| | | | | |
|---|---|---|---|---|
| 5,550,472 A | * | 8/1996 | Richard et al. | 324/320 |
| 5,635,839 A | * | 6/1997 | Srivastava et al. | 324/320 |
| 5,786,695 A | * | 7/1998 | Amor et al. | 324/320 |
| 5,864,275 A | * | 1/1999 | Ohashi et al. | 335/306 |
| 6,011,394 A | * | 1/2000 | Petropoulos et al. | 324/318 |
| 6,218,839 B1 | * | 4/2001 | Shaikh et al. | 324/320 |
| 6,311,389 B1 | * | 11/2001 | Uosaki et al. | 29/605 |
| 6,333,630 B1 | * | 12/2001 | Holsinger et al. | 324/319 |
| 6,498,488 B2 | | 12/2002 | Takeshima et al. | |
| 6,653,835 B2 | * | 11/2003 | Roeckelein et al. | 324/315 |
| 6,700,378 B2 | * | 3/2004 | Sato | 324/318 |
| 6,765,382 B2 | * | 7/2004 | Dewdney | 324/320 |
| 6,798,205 B2 | * | 9/2004 | Bommel et al. | 324/319 |
| 6,819,107 B2 | * | 11/2004 | Heid | 324/318 |
| 6,822,453 B2 | * | 11/2004 | Boemmel et al. | 324/320 |
| 6,984,982 B2 | * | 1/2006 | Huang et al. | 324/318 |
| 7,034,537 B2 | * | 4/2006 | Tsuda et al. | 324/320 |
| 7,193,416 B2 | * | 3/2007 | Harvey et al. | 324/318 |
| 7,215,231 B1 | * | 5/2007 | Morrone | 335/299 |
| 2002/0060569 A1 | | 5/2002 | Takeshima et al. | |

FOREIGN PATENT DOCUMENTS

| | | |
|---|---|---|
| JP | 9-313458 | 12/1997 |
| JP | 2001-149338 | 6/2001 |
| JP | 2002-102206 | 4/2002 |
| JP | 2002-153439 | 5/2002 |

* cited by examiner

*Primary Examiner*—Brij Shrivastav
*Assistant Examiner*—Dixomara Vargas
(74) *Attorney, Agent, or Firm*—Cooper & Dunham, LLP

(57) ABSTRACT

A magnetic resonance imaging apparatus is provided in which vibration of a gradient magnetic field coil is reduced, the vibration is not transmitted to a static magnetic field correcting unit, and space can be saved.

24 Claims, 6 Drawing Sheets

2

STRUCTURE FOR REDUCING NOISE IN MAGNETIC RESONANCE IMAGING APPARATUS

TECHNICAL FIELD

The present invention relates to a magnetic resonance imaging apparatus (hereinafter referred to as an MRI apparatus), and particularly to its configuration for correcting uniformity of the static magnetic field as well as for reducing vibration and noise from the gradient magnetic field coils.

BACKGROUND OF THE INVENTION

The standard MRI apparatuses are those that use cylindrical magnets for generating a static magnetic field which makes the inside of the cylinder the imaging region, and also those that use a pair of magnets facing each other for generating a static magnetic field which makes the space between the magnets the imaging region. The magnets generally used for generating the static magnetic field are permanent magnets, normal-conducting magnets, or superconducting magnets.

As for the MRI apparatus that uses the facing arrangement type of static magnetic field generating magnets, for example as illustrated in Patent Document 1, the known configuration places the gradient magnetic field coil on the imaging region side of the static magnetic field generating magnets, and also places the support member of the gradient magnetic field coil and the static magnetic field adjustment unit comprised of a plurality of magnetic pieces between the gradient magnetic field coil and the static magnetic field generating magnets. However, in this configuration the static magnetic field generating magnets pull the static magnetic field adjustment unit and causes distortion as a result, and it also causes distortion on the support member of the gradient magnetic field coil. This distortion creates an air gap between the gradient magnetic field coil and the support member, and the supporting effect of the member becomes imperfect because of it. The vibration is usually generated in the gradient magnetic field coil by Lorenzo force due to pulsed electric current, but the vibration tends to get bigger when the supporting effect of the support member is deficient. In Patent Document 1, to solve this problem a height adjustment means is placed between the gradient magnetic field coil and support member thereof to avoid having the air gap. Vibration of the gradient magnetic field is retrained by this means.

Patent Document 1: JP-A-2002-102206

According to the configuration being disclosed in the above-mentioned Patent Document 1, the vibration of the gradient magnetic field transmits to the static magnetic field correcting unit because the support member of the gradient magnetic field coil and the static magnetic field correcting unit are contiguous to each other. This leads to the problem of vibration being transmitted to the static magnetic field. Also, because the magnetic field adjusting unit in Patent Document 1 is not provided with a vibration-damping function, there is a need to provide an additional damping member. In order to provide an additional vibration-damping member, the interval between the gradient magnetic field coil and the static magnetic field generating unit needs to be expanded to enable the setting of a damping member. As a result, it leads to the problem of narrowing the imaging region for placing an object to be examined.

There is a need for a MRI apparatus with reduced vibration in the gradient magnetic field coil which does not transmit the vibration to the static magnetic field correcting unit, and can further save space occupied by the static magnetic field correcting unit executing the vibration-damping.

SUMMARY

In an aspect of the present disclosure, an MRI apparatus is provided which includes:

a pair of static magnetic field generating units to be arranged facing each other, for forming the static magnetic field region in the space therebetween;

the tabular gradient magnetic field generating units that are each arranged on the facing side of a pair of static magnetic field generating units via the first support member; and the static magnetic field correcting units for correcting the uniformity of the static magnetic field that are each arranged between the static magnetic field generating unit and the gradient magnetic field generating unit.

The static magnetic field correcting units are tabular shim tray with a magnetic piece for correcting the uniformity of the static magnetic field, and are arranged each on the facing side of a pair of the static magnetic field generating unit via the second support member. In the MRI apparatus of the first embodiment as described above, the vibration of the gradient magnetic field generating unit is not transmitted directly to the static magnetic field correcting unit, because the gradient magnetic field generating unit is supported by the second support member of the static magnetic field generating unit which is separate from the first support member.

In this case, the above-mentioned shim tray and the gradient magnetic field generating unit can be configured so that each of them are independently supported by the static magnetic field generating unit.

It also can be configured so that there is an air gap between the above-mentioned shim tray and the gradient magnetic field generating unit, and between the shim tray and the static magnetic field generating unit.

The configuration can be so that the above-mentioned shim tray includes one or more through-holes, and the first support member can be put through that hole. By this configuration, there is no need to provide space for vibration damping separately from the shim tray, and space can be saved.

It also can be configured to include a plurality of through-holes with a pattern predetermined by the above-mentioned shim tray, and that one or more holes out of the plurality of through holes are inserted with a magnetic member piece and an other hole or holes inserted with the first support member.

The above-mentioned first support member can be placed centrosymmetric to the gradient magnetic field generating unit.

The above-mentioned shim tray can be formed with nonmagnetic materials.

The above-mentioned shim tray can also be formed by electrically conductive materials, which can work as a conductive shield for counteracting the fluctuation of the static magnetic field.

The above-mentioned static magnetic field generating unit can be configured to include the concave portion on the facing side, and to dispose the shim tray and the gradient magnetic field generating unit in the concave portion. In this case, the member for damping the vibration in the principal plane direction of the gradient magnetic field generating unit can be placed between the inner periphery side of the concave portion and the gradient magnetic field generating unit.

The above-mentioned first support member can be configured to include the vibration-damping member.

The above-mentioned first support member can include a magnetic member and work on correcting the uniformity of the static magnetic field.

The above-mentioned first support member can be placed as not to be contiguous to the shim tray. This will prevent the vibration of the gradient magnetic field generating unit to be transmitted to the shim tray.

The above-mentioned plurality of thorough-holes in shim trays can be made in two sizes, large diameter ones and small diameter ones. Then the magnetic piece can be inserted through the small diameter holes, and the first support member can be inserted into the large diameter ones.

Out of the above-mentioned plurality of through-holes in the shim tray, into one or more through-holes that have neither magnetic member piece nor the first support member, a member for restraining the amplitude of vibration can be inserted. As the member for restraining the amplitude of vibration, an elastic member that is fixed on one end to the static magnetic field generating power supply and the other end being contiguous to the gradient magnetic field generating unit can be used. It is desirable that the member for restraining the amplitude of vibration is positioned at a loop of vibrations in the gradient magnetic field generating unit.

It also is possible to fill up one or more through-holes out of the plurality of through-holes in the shim tray, with a vibration-damping material.

The above-mentioned first support member can be configured so that the vibration-damping member is placed in between the first holding part and the second holding part. The first holding part is fixed on the static magnetic field generating unit, and the second holding part is fixed on the gradient magnetic field generating unit.

The above-mentioned first holding part can be configured to have a container-shape unit and the vibration-damping member can be placed in the container-shape unit, the second holding part can be inserted into the vibration-damping member in the container-shape unit.

The above-mentioned magnetic member piece can be formed by material combining the magnetic substance with the vibration-damping member.

In another aspect of the present disclosure, a MRI apparatus is provided which includes:
- a pair of static magnetic field generating units being placed facing each other, for forming the static magnetic field region in the space therebetween;
- the gradient magnetic field generating units being placed in the facing side of the above-mentioned static magnetic field generating units; and
- a shim tray for correcting the uniformity of the static magnetic field, being placed between the static magnetic field generating unit and the gradient magnetic field generating unit. The shim tray has plural-layer structure and at least one layer is formed by vibration-damping material, and the gradient magnetic field generating unit in mounted on the top surface of the shim tray, being supported by the shim tray.

Various examples and exemplary embodiments are described below which can achieve both reduction of the vibration of the gradient magnetic field coil and correction of the nonuniformity of the static magnetic field without expanding the spacing between the gradient magnetic field coil and the static magnetic field generating magnet.

DESCRIPTION OF EXEMPLARY EMBODIMENTS

With reference to the attached drawings, an embodiment of an MRI apparatus related to the present invention will now be described.

Figure 1:
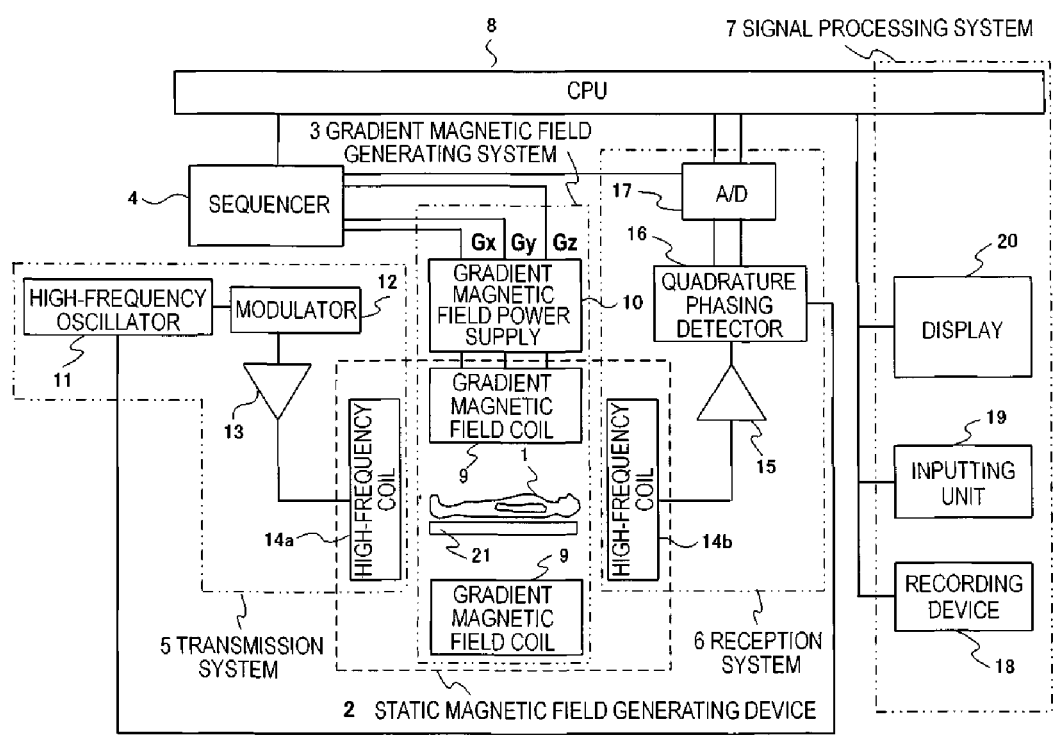
FIG. 1 is a diagram illustrating an overall configuration of an MI apparatus in a first exemplary embodiment.

An MRI apparatus of the first embodiment comprises as the general configuration thereof is illustrated in FIG. 1, static magnetic field generating unit 2, gradient magnetic field generating system 2, bed 21, transmission system 5, reception system 6, signal processing system 7, sequencer 4 and central calculation processing unit (CPU) 8.

Figure 2:
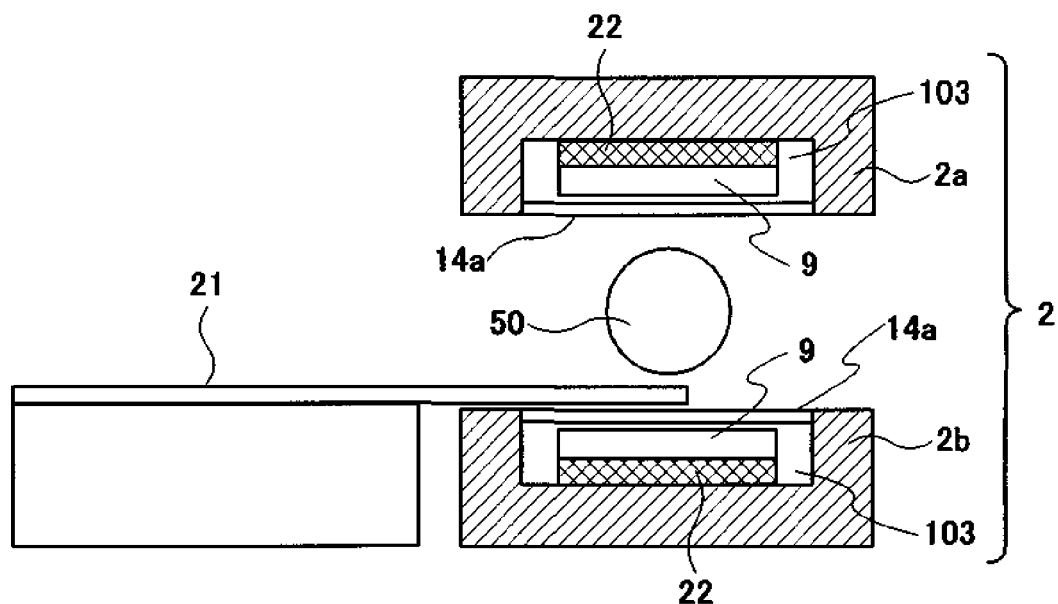
FIG. 2 is a sectional view of static magnetic field generating unit 2 and shim tray 22 of the MRI apparatus in the first exemplary embodiment.
Figure 3:
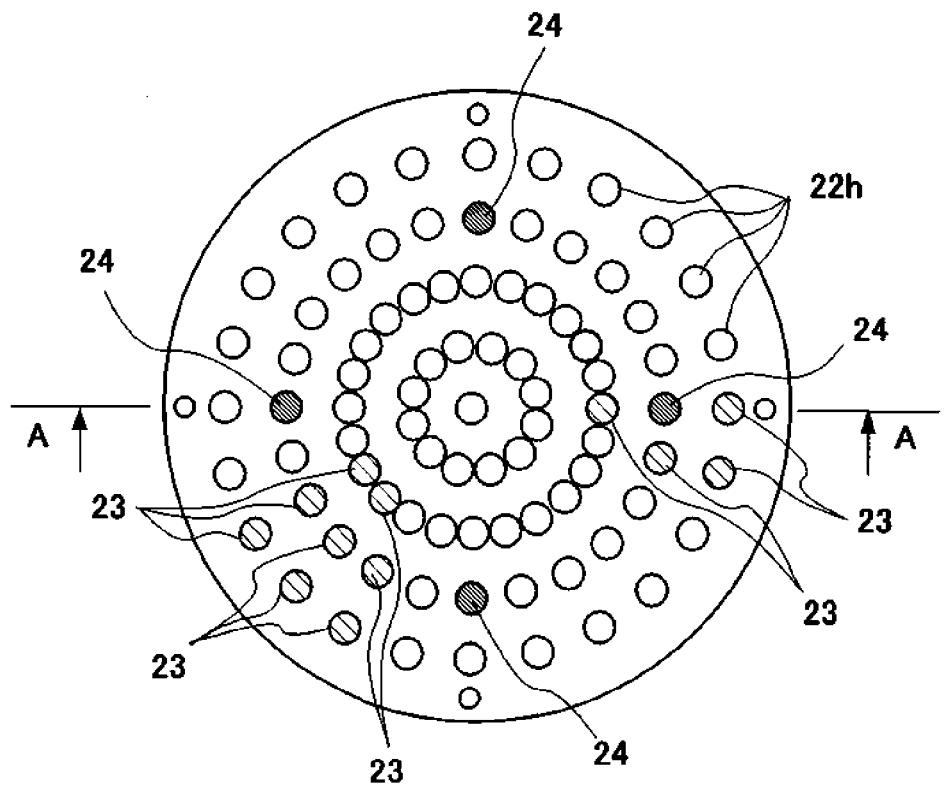
FIG. 3 is a top view of shim tray 22 of the MRI apparatus in the first exemplary embodiment.

Static magnetic field generating unit 2 includes, as illustrated in FIG. 2, a pair of static magnetic field generating magnets 2a and 2b that are placed one above the other and facing each other, tabular shim tray 22, and a linking column which is not shown in the diagram for connecting static magnetic field generating magnets 2a and 2b. The outward form of static magnetic field generating magnets 2a and 2b is cylinder with concave portion 103 in the center of the facing side, and forms the static magnetic field region (imaging region) 50 between static magnetic field generating magnets 2a and 2b. A permanent magnet, a normal-conducting magnet or a super-conducting magnet can be used for static magnetic field generating magnets 2a and 2b. Shim tray 22 is placed in each concave portion 103 of static magnetic field generating magnets 2a and 2b. Shim tray 22 retains magnetic piece 23 at the desired position as illustrated in FIG. 3, and corrects the nonuniformity of the magnetic field of static magnetic field region 50 which is formed by static magnetic field generating magnets 2a and 2b through magnetic field generated by magnetic piece 23 or through the action of the magnetic path being formed by magnetic piece 23. This improves the uniformity of static magnetic field region 50. The configuration of shim tray 22 will be described later in detail.

Besides shim tray 22, gradient magnetic field coil 9 of the gradient magnetic generating system 3 and high-frequency coil 14a of transmission system 5 are placed in concave portion 103 of static magnetic field generating magnets 2a and 2b. Shim tray 22 is placed between gradient magnetic field coil 9 and static magnetic field generating magnets 2a and 2b. Bed 21 is for mounting object 1, and for disposing the imaging portion in static magnetic field region 50.

Gradient magnetic field generating system 3 includes gradient magnetic field coil 9 for applying the desired gradient magnetic field toward static magnetic field region 50 in each direction of X, Y and Z-axis, and gradient magnetic field power supply 10 for providing the driving current to gradient magnetic field coil 9.

Transmission system 5 includes high-frequency oscillator 11, modulator 12, high-frequency amplifier 13 and high-frequency coil 14a. The high-frequency signals transmitted from high-frequency oscillator 11 are modulated to the frequency according to the indication from sequencer 4, amplified by high-frequency amplifier 13, and transferred to high-frequency coil 14a on the transmitting side. High-frequency coil 14a on the transmitting side generates the high-frequency magnetic field from received high-frequency signals, and irradiates it to object 1 in the static magnetic field region 50.

Reception system 6 includes high-frequency coil 14b on the receiving side, amplifier 15, quadrature phase detector 16 and A/D converter 17. The magnetic resonance (MR) signals generated from object 1 are received by high-frequency coil 14b, amplified by amplifier 15, detected by quadrature phase detector 16, and A/D converted by A/D converter 17. In addition, center frequency to be the reference for detection by quadrature phase detector 16 is set from high-frequency oscillator 11 to quadrature phase sensitive detector 16.

Signal processing system 7 includes CPU 8, display 20, inputting unit 19 and record reproducer 18. CPU 8 receives MR signal data from A/D converter 17 of reception system 6, and executes the processing and the image reconstruction. The obtained images are displayed on display 20. The conditions for the image reconstruction are received from the operator via inputting unit 19. CPU 8 stores the reconstructed images or MR signal data as the need arises to record reproducer 18.

CPU 8, in the case of receiving the indication from inputting unit 19 for starting the imaging process, sets the pulse sequence in sequencer 4 by reading out and executing the program being stored in the embedded memory in advance for actualizing the predetermined imaging. The conditions for imaging are received from the operator via inputting unit 19. Sequencer 4 makes gradient magnetic field power supply 10, modulator 12 and A/D converter 17 operate by outputting the controlling signals in predetermined timing according to the pulse sequence being set by CPU 8. In concrete terms, sequencer 4 transmits the control signals to gradient magnetic field power supply 10, and makes the gradient magnetic field coil 9 generate the gradient magnetic field of the desired direction to the imaging space. At the same time, sequencer 4 transmits the command to modulator 12 to generate predetermined high-frequency magnetic field waveforms, generates the high-frequency magnetic field pulses from high-frequency coil 14a, and applies them to object 1. MR signals being generated from object 1 are received by high-frequency coil 14b, detected by detector 16, and used for imaging reconstruction by CPU 8.

Here the configuration of shim tray 22 will be described in detail referring to FIG. 3 and FIG. 4. Shim tray 22 is a circular disk with a plurality of through holes 22h placed in the predetermined pattern as illustrated in FIG. 3, and formed by nonmagnetic materials. As nonmagnetic materials, for example, nonmagnetic and electrically conductive metals such as aluminum or copper, and resins such as FRP (Fiber Reinforced Plastics) or glass epoxy resin can be used. The arrangement pattern for through-holes 22h is illustrated in FIG. 3 as an example in a radial pattern at a regular interval from the center of shim tray 22, but it is possible to have other arrangement patterns or an arrangement in a random order.

Figure 4:
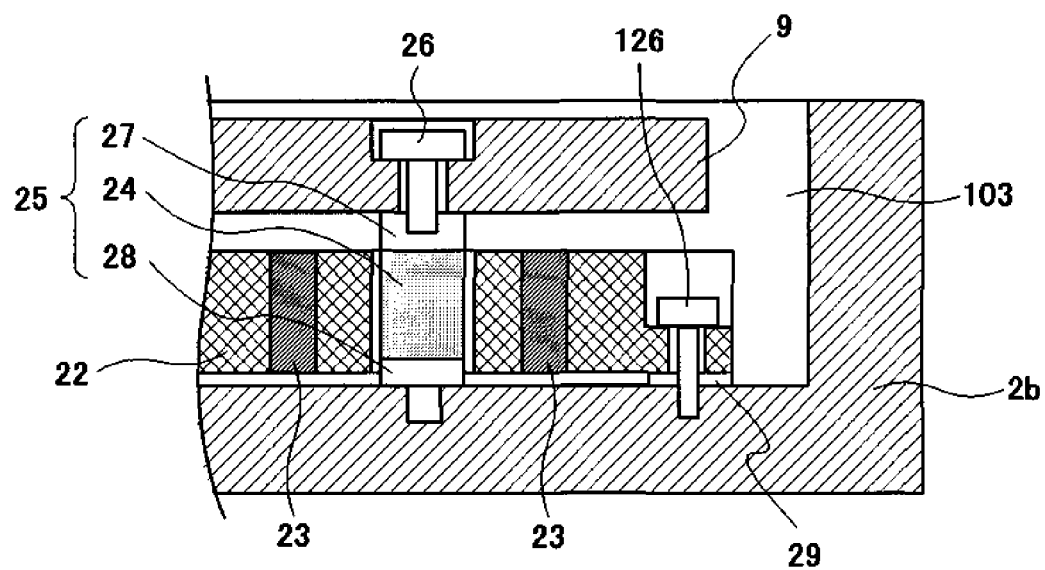
FIG. 4 is a sectional view of static magnetic field generating magnet 2a and shim tray 22 of the MRI apparatus in the first exemplary embodiment.

Shim tray 22 is supported by support member 29 being placed on static magnetic field generating magnets 2a and 2b as illustrated in FIG. 4. Support member 29 supports the shim tray in a way that shim tray 22 and static magnetic field generating magnets 2a and 2b do not touch each other directly but to have a slight air gap in between. Bolt 126 fixes shim tray 22 to support member 29 and static magnetic field generating magnets 2a and 2b. Into a portion of a plurality of through-holes 22h of shim tray 22, magnetic piece 23 for correcting the nonuniformity of the static magnetic field being formed by static magnetic field generating magnets 2a and 2b are inserted. Into a portion of through-holes 22h of which magnetic piece 23 is not inserted, support member 25 is inserted. Support member 25 supports gradient magnetic field coil 9 corresponding to static magnetic field generating magnets 2a and 2b. And support member 25 supports gradient magnetic field coil 9 in a way that there will be a slight (for example, a few mm) air gap between gradient magnetic field coil 9 and shim tray 22. In other words, both shim tray 22 and gradient magnetic field coil 9 are independently supported by static magnetic field generating unit 2a and 2b, shim tray 22 through support member 29 and gradient magnetic field coil 9 through support member 25. Support member 25 here does not touch the inner wall of through holes 22h in shim tray 22.

Support member 25 includes vibration-damping member 24, bolt 28 being fixed to the end of each vibration-damping member, and pedestal 27. As vibration-damping member 24, the columnar member being formed by the material with a strong damping function which convert the vibration into heat energy such as rubber, plastic or a combined member of metal and rubber can be used. The shape of vibration-damping member 24 should be designed taking the vibration-damping feature of the material and the vibration mode of gradient magnetic field coil 9 into consideration, in a way that the mode of vibration can be effectively restrained. Bolt 28 and pedestal 27 are fixed to vibration-damping member 24 by adhesion bond or the screw.

Bolt 28 of support member 25 is fixed to static magnetic field generating magnets 2a and 2b. On the other hand, the female screw is formed in pedestal 27, and it joins together with bolt 26 which pierces through gradient magnetic field coil 9. Through-hole 22h that is at a suitable position for placing support member 25 and to have put support member 25 through is selected, taking the form or vibration-mode of gradient magnetic field coil 9 into consideration. Concretely, the hole that is able to support gradient magnetic field coil 9 and is positioned in the most suitable place for preventing the vibration of gradient magnetic field coil 9 is selected. For example, support member 25 is placed in the centrosymmetric position of gradient magnetic field coil 9. In this case, it is desirable to position support member 25 at a loop of vibrations in the main vibration mode that have high amplitude. As for the number of support members 25, one or more are required to support gradient magnetic field coil 9, and four support members 25 (vibration-damping members 24) are required for supporting gradient magnetic field coil 9 as an example in FIG. 4. However, the desired number of support members 25 can be positioned without limiting it to four members. And when positioning one support member 25, it can be positioned in the center of gradient magnetic field coil 9.

Magnetic piece 23 includes magnetic material such as iron, of a quantity that is able to obtain the desired magnetizing force, and is formed in a shape that makes it possible for insertion into through-hole 22h. For magnetic piece 23, material such as ferromagnetic material, permanent-magnetic material or soft-magnetic material can be used. Magnetic piece 23 is for correcting the nonuniformity of the magnetic field of static magnetic field generating magnets 2a and 2b through the magnetic field being generated from magnetic piece 23 or through the effect caused by the magnetic path being formed by magnetic piece 23. For example, when magnetic piece 23 including nonmagnetic iron is arranged in the static magnetic field, it generates the magnetic field which strengthens the static magnetic field and corrects the nonuniformity of it. Also, with placing magnetic piece 23 including the magnetized permanent magnet so that the direction of the magnetic field being generated by magnetic piece 23 will be the same as the direction of the static magnetic field, the static magnetic field will be strengthened and the nonuniformity of the static magnetic field can be corrected. If it is placed in the opposite direction, the static magnetic field will be weakened which also lead to the correction of the static magnetic field. Furthermore, the nonuniformity of the static magnetic field can be corrected by placing static piece 23 including soft-magnetic material in a position where magnetic flux density is rough and pulling the magnetic flux around it. Thus as for magnetic piece 23, any material can be used as long as it generates the intended magnetic property when placed in the static magnetic field of static magnetic field generating magnets 2a and 2b, and whether to magnetize that material in advance can be determined according to the need in each case.

As for the concrete configuration of magnetic piece 23, for example, a piece with the desired amount of magnetic substance (iron, for instance) being enwrapped with nonmagnetic material such as resins, or a piece with a magnetic substance being dispersed in a nonmagnetic material can be used. The outer shape of magnetic piece 23 can be, for example, a cylinder shape being conformed to the shape of through-hole 22h. Also magnet piece 23 can be easily attached to through-hole 22h, by forming a female-screw on the inner wall of through-hole 22h and forming magnetic piece 23 in the shape of a male-screw to mesh with it. Moreover, the correction for the nonuniformity of the static magnetic field can easily be performed by preparing plural kinds of magnetic pieces for magnetic piece 23 with each different magnetization quantity in order to be able to obtain plural quantity of magnetization, selecting the right piece with a necessary magnetization quantity according to the measurement result of nonuniformity of static magnetic field region 50, and attaching it to through-hole 22h.

Attachment procedure for shim tray 22 at the time of manufacturing and installing MRI apparatus is as follows. First, magnetic uniformity of static magnetic field region 50 being formed by static magnetic field generating unit 2 is measured. According to the result of measurement, magnetization quantity of magnetic piece 23 and the position for through-hole 22h for placing it that are necessary for acquiring the desired degree of static magnetic field uniformity are obtained by calculation. In the case that the position of through-hole 22h for inserting magnetic piece 23 overlaps with the position of through-hole 22h for placing support member 25, a priority is to be made for placing support member 25. This case can be handled by, for example, displacing the position of magnetic piece 23 to adjacent through-hole 23. Shim tray 22 wherein magnetic piece 23 is attached in one or more through-holes 22h is placed in concave portion 103 of static magnetic field generating magnets 2a and 2b, and fixed with bolt 126. Without touching the inner wall, support member 25 is put through one of through-holes 22h being appointed in advance at the time of designing, and bolt 28 of support member 25 is fixed on static magnetic field generating magnets 2a and 2b. Gradient magnetic field coil 9 is set on shim tray 22 and fixed on pedestal 27 of support member 25 by bolt 26. High-frequency coil 14a is further placed on the upper part of concave portion 103.

In this way with arranging shim tray 22, the nonuniformity of the static magnetic field can be corrected by magnetic piece 23 being attached in through-hole 22h of shim tray 22, which leads to improved static magnetic field uniformity and provides reconstructed images with a higher degree of accuracy. Furthermore, by being able to damp the vibration of gradient magnetic field coil 9 by converting it into heat energy with support member 25 being set in through-hole 22h of shim tray 22, there is no need for arranging another vibration-damping member on top of shim tray 22 which results in offering a low-profile static magnetic field generating magnets 2a and 2b. This makes it possible to provide an MRI apparatus that damps vibration of the gradient magnetic coil and the noise that accompanies the vibration. Also, even when concave portion 103 of static magnetic field generating magnets 2a and 2b are shallow, since gradient magnetic field coil 9 or high-frequency coil 14a does not have to be placed being protruded on the side of static magnetic field region 50, a wider range of static magnetic field region (imaging space) 50 can be offered and thus giving a less fear of being confined to object 100. These factors enable the provision of an MRI apparatus while reconstructing images with a higher degree of accuracy, reduced vibration and noise, and a wider range static magnetic field 50 that puts a less burden on an object.

Also, since support member 25 and shim tray 22 do not touch each other, the vibration of gradient magnetic field coil 9 is transmitted to shim tray 22 via support member 25, static magnetic field generating magnets 2a and 2b, and support member 29. Consequently, compared with a case in which the vibration is transmitted directly from gradient magnetic coil 22, the transmission channel of the vibration is longer, which offers the effect of reducing the vibration of shim tray 22.

In addition, though the above description is prioritizing support member 25 in the case that through-hole 22h for placing magnetic piece 23 and through-hole 22h for placing support member 25 are overlapping, it is possible to give support member 25 the function of magnetic piece 23 by using a material with a desired magnetization for support member 25. This will eliminate the need for displacing the position of magnetic piece 23 and enables more accurate correction of the uniformity of the static magnetic field. The composition of support member 25 containing the desired magnetization can be an adjunctive one by, for example, dispersing a desired quantity of iron powder in vibration damping member 24. Also, pedestal 27 or bolt 28 can be composed of a magnetic member with a desired quantity of magnetization, or a magnetic piece can be implanted in pedestal 27 or bolt 28.

For magnetic piece 23, a piece in which the vibration-damping member being dispersed with magnetic powder such as iron powder and molded by compression or other means can be used. With the use of magnetic piece 23, Lorentz force generated in magnetic piece 23 by the gradient magnetic field from gradient magnetic field coil 9 can be damped by a vibration-damping member. This can restrain the accrual of the vibration in shim tray 22 through Lorentz force being generated in magnetic piece 23.

Also into a hole out of through-holes 22h in shim tray 22 in which neither support member 25 nor magnetic piece 23 is placed, vibration-damping member 24 can also be inserted. This will offer the effect of damping the vibration of shim tray 22.

Moreover in the case of forming shim tray 22 with an electrically conductive material such as aluminum or copper, it is possible to function as an electrically conductive shield for negating the variation of the static magnetic field being generated by the vibration of static magnetic field generating magnets 2a and 2b. This electrically conductive shield is a well-known technique, for example using an aluminum shield, wherein the eddy current is generated by the variance of static magnetic field and the magnetic field generated by this eddy current works to negate the variance of the static magnetic field.

Figure 6:
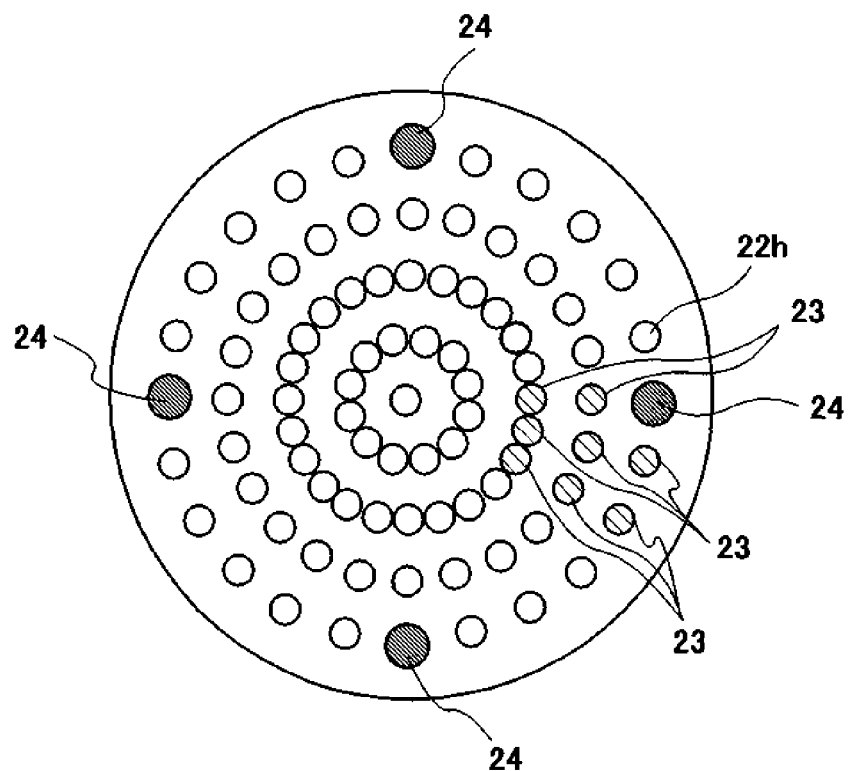
FIG. 6 is a top view of shim tray 22 of the MRI apparatus in the first and second exemplary embodiments.

The above-mentioned support member 25 has a tendency that the diameter becomes larger as attempting to gain more effect of damping the vibration. On the other hand, magnetic piece 23 can correct the nonuniformity of the static magnetic field more accurately when being arranged with many pieces of a smaller diameter (for example, φ 6~8 mm). Given this factor, out of through-holes 22h, the ones for putting support member 25 (vibration-damping member 24) through can be formed in advance with large diameter, and other through-holes 22h can be formed with small diameter to match with magnetic piece 23 as illustrated in FIG. 6. This makes it possible to use both support member 25 with a large diameter and magnetic piece 23 with a small diameter, and enables to improve the support intensity of gradient magnetic field coil 9 and to correct the nonuniformity of static magnetic field with higher accuracy at the same time.

The Second Embodiment

An MRI apparatus of the second embodiment is different from the first embodiment in the configuration of support member 25. The descriptions of the other configurations will be omitted since they are the same as the ones in the first embodiment.

Figure 5:
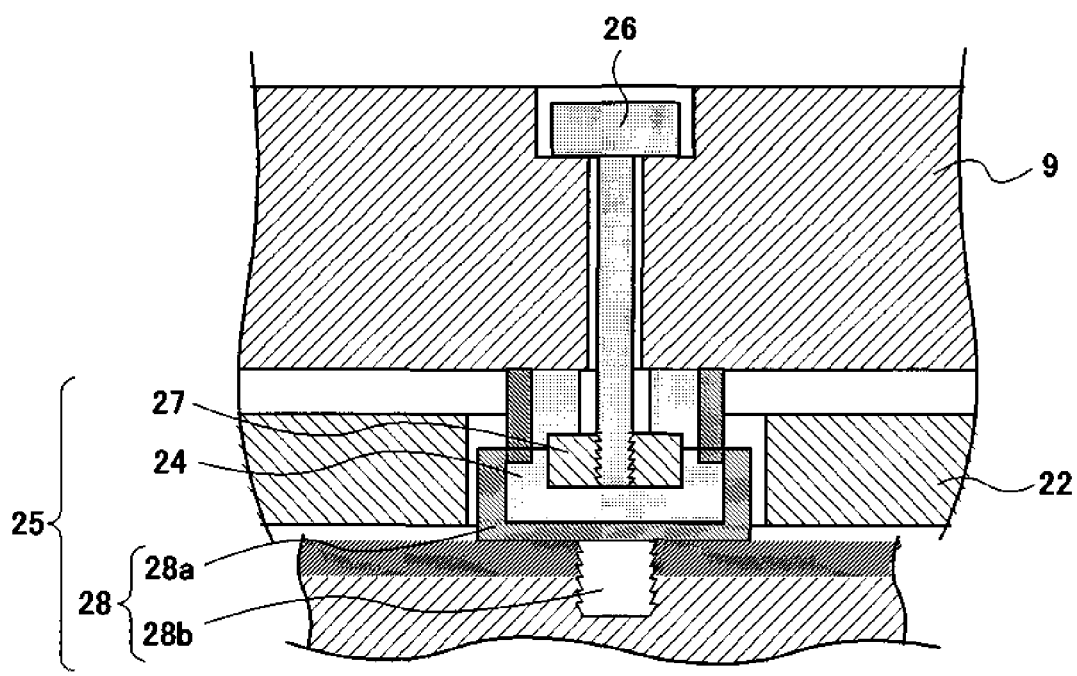
FIG. 5 is an enlarged sectional view of shim tray 22 and support member 25 of the MRI apparatus in a second exemplary embodiments.

Support member 25 in the second embodiment, as illustrated in FIG. 5, is using bolt 28 with a structure wherein male-screw 28b is fixed at the bottom part of container 28a being formed by a material with stiffness such as a metal, and vibration-damping member 24 being made of a material such as rubber, is filled inside of container 28a. Pedestal 27 with a screw hole is implanted in vibration-damping member 24. Thus pedestal 27 and container 28a are not touching each other, and are placed with vibration-damping member 24 in between. Gradient magnetic coil 9 is fixed to pedestal 27 by bolt 26.

Support member 25 in FIG. 5 contains vibration-damping member 24 in container 28b, and has a configuration of implanting pedestal 27 inside of the vibration-damping member, which gives support member 25 the feature of having a high intensity of and an enhanced effect on vibration-damping. Thus even the heavy weight of gradient magnetic field coil 9 can be supported by a small number of support members 25, and the effect on damping vibration is high.

With regard to support member 25 of the second embodiment, the one with high effect on damping the vibration can easily be designed, but because of its structure the diameter tends to become larger. The diameter for support member 25 of the second embodiment turns out to be, approximately for example, φ 40~50 mm, depending on the design. On the other hand, correction of the nonuniformity of the static magnetic field can be performed more accurately when many holes with small diameter (for example, φ 6~8 mm) are placed. Thus for shim tray 22, the configuration wherein only through-holes 22h for putting support member 25 through have large diameter can be used as seen in FIG. 6.

The Third Embodiment

An MRI apparatus in the third embodiment is different from the one in the first embodiment in the configuration of support member 25. The description on the other configuration will be omitted since they are the same as of the first embodiment.

Figure 7:
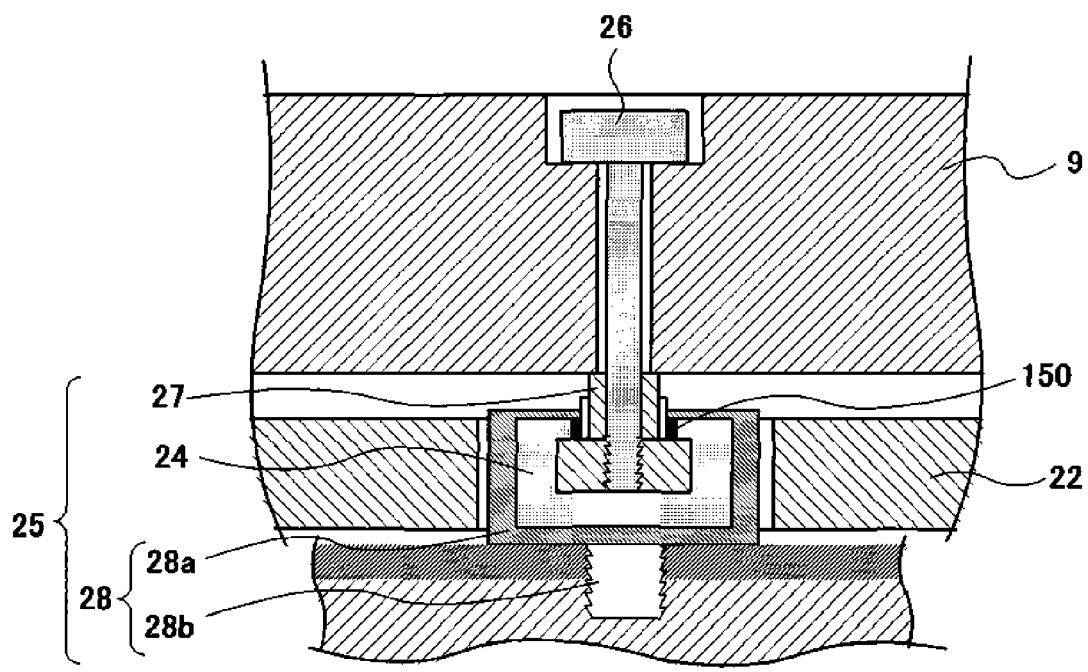
FIG. 7 is an enlarged sectional view of shim tray 22 and support member 25 of the MRI apparatus in third exemplary embodiment.

Support member 25 in the third embodiment, as illustrated in FIG. 7, is using bolt 28 with a structure wherein male-screw 28b is fixed at the bottom part of container 28a being formed by a material with stiffness such as a metal, and vibration-damping member 24 is filled inside of container 28a. Pedestal 27 with a screw hole is implanted in vibration-damping member 24. Container 28a takes a form that the aperture is narrowed, and is configured in a way that this narrowed aperture is blocked off by pedestal 27, and further sealed with sealing material 150.

Therefore in this embodiment, other than solid elastic member such as rubber, viscous fluid such as oil, butane series polymer and silicon series polymer, or granular substance that cause big friction such as slug or sand powder can be used as vibration-damping member 24 by enclosing in container 28a.

Furthermore, support member 25 of the present embodiment is configured in a way that vibration-damping member 24 is contained in container 28b, which enhances the intensity of support member 25 and improves the effect of damping the vibration.

For shim tray 22, the configuration wherein only through-holes 22h for putting support member 25 through have large diameter can be used as seen in FIG. 6.

The Fourth Embodiment

An MRI apparatus of the fourth embodiment will be described referring to FIG. 8. The MRI apparatus in FIG. 8 further arranged a means for directly reducing the amplitude of vibration mode such as main vibration mode with big amplitude or vibration mode contributing to resonance or noise, being caused in gradient magnetic field coil 9. Concretely, columnar amplitude-suppressing member 124 being formed by an elastic material is set up in through-hole 22h positioned where the amplitude of the vibration mode is high (a loop of the vibration or in the vicinity of it), and reduces the vibration by making the head portion of amplitude-suppressing member 124 touch to gradient magnetic field coil 9 so that the vibration of gradient magnetic coil 9 is directly suppressed. Support member 25 and magnetic piece 23 are to be placed the same way as the first embodiment. The other configuration as well is the same as of the first embodiment.

Columnar amplitude-suppressing member 124 can be any elastic body, and the one wherein bolt 28 is attached to vibration-damping member 24 is used, similarly as support member 25 in the first embodiment. The length of the head of vibration-damping member 24 is adjusted so that the head will touch gradient magnetic field coil 9.

The position of through-hole 22*h* to be selected to place amplitude-suppressing member 124 should be at a loop of vibrations in gradient magnetic field coil 9 or in the vicinity of it. This enables efficient suppression of the vibration. However, since numerous vibration modes are to be found in gradient magnetic field coil 9, it is realistically difficult to place amplitude-suppressing member 124 at the loop of vibration in all of the vibration modes. Thus the vibration modes contributing to noise or resonance should be selected, and amplitude-suppressing member 124 should be placed at the loop of those vibrations or in the vicinity of it.

Also, by using the magnetic material with desired amount of magnetization for vibration-damping member 24 of amplitude-suppressing member 124, can serve the function of both the amplitude-suppressing member and magnetic piece 23.

Figure 8:
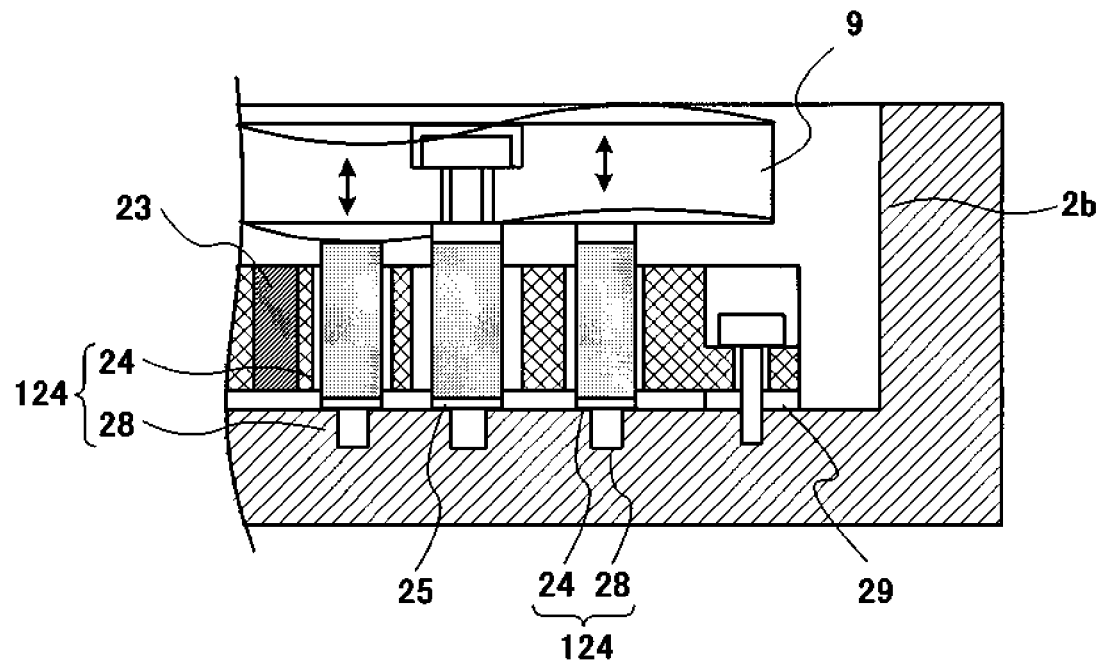
FIG. 8 is a sectional view of static magnetic field generating magnet 2a and shim tray 22 of the MRI apparatus in a fourth exemplary embodiment.

Also, support member 25 being illustrated in FIG. 5 or FIG. 7 can be used as support member 25 in the configuration illustrated in FIG. 8.

The Fifth Embodiment

Figure 9:
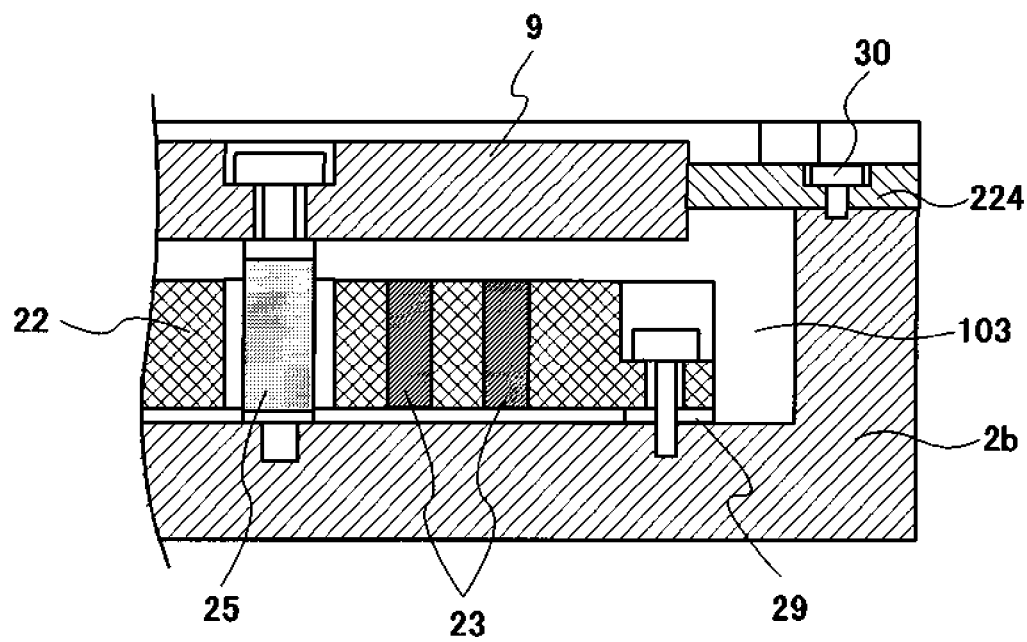
FIG. 9 is a sectional view of static magnetic field generating magnet 2a and shim tray 22 of the MRI apparatus in a fifth exemplary embodiment.

In the fifth embodiment, in addition to the configuration illustrated in the first through fourth embodiment, a ring-shaped vibration-damping member 224 is placed on the peripheral portion of gradient magnetic field coil 9 as seen in FIG. 9.

Ring-shaped vibration-damping member 224 is fixed to static magnetic field generating magnets 2*a* and 2*b* with bolt 30. The inner periphery surface of ring-shaped vibration-damping member 224 reduces the vibration toward principal plane direction of gradient magnetic field coil 9 by abutting the outer periphery surface of gradient magnetic field coil 9.

In this way, the vibration in gradient magnetic field coil 9 can be restrained, toward perpendicular direction by supporting with support member 25 and toward principal direction by ring-shaped vibration-damping member 224. Additionally, though the example was illustrated in which the first embodiment was used for shim tray 22 and support member 25 in FIG. 9, the second fourth embodiment can also be applied.

Also, though ring-shaped vibration-damping member 224 is used in FIG. 9, by arranging rod-like vibration-damping member instead from the inner wall of concave portion 103 toward gradient magnetic field coil 9 in all directions or in a random manner, the same effect can be achieved.

The Sixth Embodiment

Figure 10:
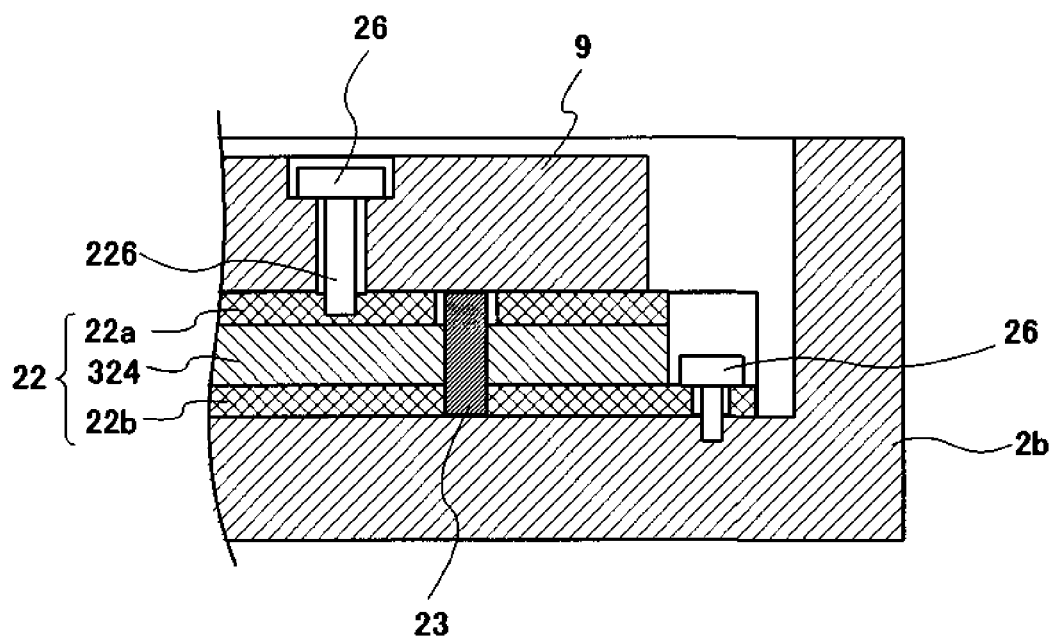
FIG. 10 is a sectional view of static magnetic field generating magnet 2a and shim tray 22 of the MRI apparatus in a sixth exemplary embodiment.

Next, an MRI apparatus of the sixth embodiment relating to the present invention will be described referring to FIG. 10. In the sixth embodiment, shim tray 22 is configured in 3-layer structure, and middle-layer 324 is formed with the vibration-damping member. Top-layer 22*a* positioned on the side of gradient magnetic field coil 9 and bottom-layer 22*b* on the side of static magnetic filed generating magnets 2*a* and 2*b* are formed by non-magnetic material such as aluminum or FRP (Fiber Reinforced Plastics) similar to the first embodiment.

In shim tray 22 of 3-layer construction, through-holes 22*h* are formed as illustrated in FIG. 3 of the first embodiment, and magnetic piece 23 is inserted in the hole being positioned where the correction of the static magnetic field is necessary. Magnetic piece 23 has the same feature as described in the first embodiment. Static magnetic field coil 9 is mounted on shim tray 22, and fixed to screw-hole 226 being formed in the top-layer 22*a* of shim tray 22, with bolt 26. The other configuration of the MRI apparatus is the same as the first embodiment.

In the case of shim tray 22 of 3-layer structure in FIG. 7, the vibration of gradient magnetic field coil 9 can be reduced by converting the vibration into heat-energy with vibration-damping layer 24 of shim tray 22. Also by magnetic piece 23 being placed in shim tray 22, the nonuniformity of the static magnetic field being generated by static magnetic field generating magnets 2*a* and 2*b* can be corrected.

The present invention provides Various examples and exemplary embodiments of an MRI apparatus are described that are compact in size, yet can offer the uniformity of the static magnetic field that is high in accuracy, with reduced vibration and noise from the gradient magnetic field coil that result in imposing less burdens on an object to be examined.

A magnetic resonance imaging apparatus is described herein in which vibration of a gradient magnetic field coil is reduced, the vibration is not transmitted to a static magnetic field correcting unit, and the space can be saved. A tabular gradient magnetic field generating unit is placed over each opposing surface of support member therebetween. A static magnetic field correcting unit for correcting the uniformity of the static magnetic field is placed between the static magnetic field generating unit and the gradient magnetic field generating unit. The static magnetic field correcting unit is a tabular shim tray provided with magnetic body pieces for correcting the uniformity of the static magnetic field, and is placed over each of the pair of the opposing surfaces of static magnetic field generating units, with a second supporting member therebetween. Since the gradient magnetic field generating unit is thus supported by the static magnetic field generating unit through the second support member different from the first support member, vibration from the gradient magnetic field generating unit is not transmitted directly to the static magnetic field correcting unit.

The invention claimed is:

1. An MRI apparatus comprising:
   a pair of static magnetic field generating units placed facing each other, and for forming a static magnetic field region in a space there between,
   a tabular gradient magnetic field generating unit supported on a facing surface of the respective static magnetic field generating units, each via a first support member; and
   static magnetic field correcting units each arranged between the static magnetic field generating unit and the gradient magnetic field generating unit, for correcting static magnetic field uniformity,
   wherein the static magnetic field correcting unit is a tabular shim tray on which a magnetic piece for correcting the static magnetic field uniformity is placed, and being placed respectively via a second support member on the facing surface of the pair of static magnetic field generating units.

2. The MRI apparatus according to claim 1, wherein the shim tray and the gradient magnetic field generating unit are independently supported by the static magnetic field generating unit.

3. The MRI apparatus according to claim 2, wherein the first support member includes a magnetic member, for correcting the uniformity of the static magnetic field.

4. The MRI apparatus according to claim 1, wherein the air gap is provided between the shim tray and the gradient magnetic field generating unit, both of which are supported by the same static magnetic field generating unit, and between the shim tray and the static magnetic field generating unit which supports the shim tray.

5. The MRI apparatus according to claim 4, wherein the first support member includes a magnetic member, for correcting the uniformity of the static magnetic field.

6. The MRI apparatus according to claim 1, wherein the shim tray includes one or more through-holes, and the first support member is placed in the through-hole.

7. The MRI apparatus according to claim 6, wherein the first support member includes a magnetic member, for correcting the uniformity of the static magnetic field.

8. The MRI apparatus according to claim 1, wherein the shim tray is provided with a plurality of through-holes with predetermined pattern, in which one or more holes or the plurality of through-holes have the magnetic piece inserted, and other one or more through-holes have the first support member inserted.

9. The MRI apparatus according to claim 8, wherein a plurality of through-holes of the shim tray have two kinds of diameters that are large and small, in which the magnetic piece is inserted in the through-hole with a small diameter and the first support member is inserted in the through-hole with a large diameter.

10. The MRI apparatus according to claim 8, wherein a member for suppressing the vibration amplitude of the gradient magnetic field generating unit is inserted in one or more through-holes out of the plurality of the through-holes of the shim tray which have neither the magnetic piece nor the first support member is placed, and the amplitude-suppressing member is an elastic member or which one end is fixed to the static magnetic field generating unit and the other end contacts the gradient magnetic field generating unit.

11. The MRI apparatus according to claim 10, wherein the amplitude-suppresing member is placed at a loop of the vibrations in the gradient magnetic field generating unit.

12. The MRI apparatus according to claim 8, wherein a vibration-damping material is filled in one or more through-holes out of the plurality of through-holes of the shim way in which neither the magnetic piece nor the support member is placed.

13. The MRI apparatus according to claim 1, wherein the first support member is placed in centrosymmetric position corresponding the gradient magnetic field generating unit.

14. The MRI apparatus according to claim 1, wherein the shim tray is formed by a non-magnetic material.

15. The MRI apparatus according to claim 14, wherein the shim tray is formed by a material which is electrically conductive.

16. The MRI apparatus according to claim 1, wherein the static magnetic field generating unit has a concave portion on the facing surface, and the shim tray and the gradient magnetic field generating unit are placed in the concave portion.

17. The MRI apparatus according to claim 16, wherein a member for restraining the vibration in the principal-plane direction of the gradient magnetic field generating unit is placed between the inner surface of the concave portion and the gradient magnetic field generating unit.

18. The MRI apparatus according to claim 1, wherein the first support member includes a vibration-damping member.

19. The MRI apparatus according to claim 1, wherein the first support member includes a magnetic member, for correcting the uniformity of the static magnetic field.

20. The MRI apparatus according to claim 1, wherein the first support member and the shim tray do not touch each other.

21. The MRI apparatus according to the claims claim 1, wherein the first support member comprises the first holding part and the second holding part placed with the vibration-damping member therebetween, and that the first holding part is fixed to the static magnetic field generating unit and the second holding part is fixed to the gradient magnetic field generating unit.

22. The MRI apparatus according to claim 21, wherein the first holding part has a container-shaped portion and the vibration-damping member is placed in the container-shaped portion, and the second holding part is inserted in the vibration-damping member being placed in the container-shaped portion.

23. The MRI apparatus according to claim 1, wherein the magnetic piece is formed with a material that is the vibration-damping member being combined with a magnetic substance.

24. The MRI apparatus including:
   a pair of static magnetic field generating units being placed facing each other, for forming a static magnetic field region in the spacing in between;
   a gradient magnetic field generating unit being respectively arranged in the facing surface of a pair of static magnetic field generating units; and
   a shim tray being placed between the static magnetic field generating unit and the gradient magnetic field generating unit, for correcting the uniformity of the static magnetic field,
   wherein the shim tray has plural layers of structure and at least one layer is formed by a vibration-damping material, and the gradient magnetic field generating unit is mounted on the surface of the shim tray and supported by the shim tray.

* * * * *

UNITED STATES PATENT AND TRADEMARK OFFICE
CERTIFICATE OF CORRECTION

PATENT NO.         : 7,375,518 B2
APPLICATION NO. : 10/595362
DATED                : May 20, 2008
INVENTOR(S)       : Akira Kurome and Yoshihide Wadayama It is certified that error appears in the above-identified patent and that said Letters Patent is hereby corrected as shown below:

Replace column 12, lines 11-14, with the following:

-- In the case of shim tray 22 of 3-layer structure in FIG. [[7]] 10, the vibration of gradient magnetic field coil 9 can be reduced by converting the vibration into heat-energy with vibration damping layer [[24]] 324 of shim tray 22. Also by magnetic piece 23 being placed in shim tray 22, the nonuniformity of the static magnetic field being generated by static magnetic field generating magnets 2a and 2b can be corrected. --

Signed and Sealed this

Fourteenth Day of April, 2009

JOHN DOLL
*Acting Director of the United States Patent and Trademark Office*